US012706595B1

(12) United States Patent
Roy

(10) Patent No.: US 12,706,595 B1
(45) Date of Patent: Aug. 11, 2026

(54) MARX GENERATOR WITH PULSATING POWER BUFFER

(71) Applicant: Wisconsin Alumni Research Foundation ("WARF"), Madison, WI (US)

(72) Inventor: Jinia Roy, Madison, WI (US)

(73) Assignee: Wisconsin Alumni Research Foundation ("WARF"), Madison, WI (US)

( * ) Notice: Subject to any disclaimer, the term of this patent is extended or adjusted under 35 U.S.C. 154(b) by 0 days.

(21) Appl. No.: 19/192,625

(22) Filed: Apr. 29, 2025

(51) Int. Cl.
*H03K 3/57* (2006.01)
*H03K 3/013* (2006.01)
*H03K 7/08* (2006.01)

(52) U.S. Cl.
CPC ............... *H03K 3/57* (2013.01); *H03K 3/013* (2013.01); *H03K 7/08* (2013.01)

(58) Field of Classification Search
CPC ............. H03K 3/57; H03K 3/013; H03K 7/08
See application file for complete search history.

(56) References Cited

U.S. PATENT DOCUMENTS

| | | | |
|---|---|---|---|
| 8,964,419 | B2 | 2/2015 | Ryoo et al. |
| 2018/0175719 | A1 | 6/2018 | Ying et al. |
| 2019/0157968 | A1 | 5/2019 | Tsuchiya |
| 2021/0203248 | A1 | 7/2021 | Du |
| 2022/0060134 | A1 | 2/2022 | Ionescu |
| 2023/0006535 | A1 | 1/2023 | Freihedo Fernandez |

FOREIGN PATENT DOCUMENTS

| | | | |
|---|---|---|---|
| WO | 2025193431 | A1 | 9/2025 |

OTHER PUBLICATIONS

Zhengyi Zhong et al., "Review on Solid-State-Based Marx Generators", IEEE Transactions on Plasma Science, vol. 49, No. 11, Nov. 2021, pp. 3625-3643, https://ieeexplore.ieee.org/document/9600453.
Applied Physical Electronic, "Dual Uses of Pulsed Power in Defense & Industry", https://apelc.com/dual-uses-of-pulsed-power-in-defense-industry/, Sep. 24, 2024.
Written Opinion of the International Searching Authority dated Apr. 30, 2025 for International Application No. PCT/US2025/017186, filed Feb. 25, 2025.
International Search Report dated Apr. 30, 2025 for International Application No. PCT/US2025/017186, filed Feb. 25, 2025.

*Primary Examiner* — Robert L Deberadinis
(74) *Attorney, Agent, or Firm* — Brian D. Kaul; Westman, Champlin & Koehler, P.A.

(57) ABSTRACT

A power stage of a pulsed power generator includes a half bridge based Marx generator power cell and a pulsating power buffer. The power cell includes a main capacitor, and a main half bridge switch circuit connected in parallel with the main capacitor and configured to alternately connect the main capacitor in series or in parallel with a main storage capacitor of an adjoining power stage. The pulsating power buffer includes an auxiliary capacitor, an inductor, and an auxiliary half bridge switch circuit, which includes first and second switches that are switched in a complementary manner based on a voltage across the main capacitor to deliver a discharge current from the auxiliary capacitor through the inductor that supplements the main voltage during a discharging phase, and to deliver a charge current to the auxiliary capacitor through the inductor that increases a voltage across the auxiliary capacitor during a charging phase.

20 Claims, 4 Drawing Sheets

MARX GENERATOR WITH PULSATING POWER BUFFER

FIELD

Embodiments of the present disclosure relate to pulsed power generation and, more particularly, to pulsed power generation using a power stage that combines a Marx generator with a pulsating power buffer.

BACKGROUND

Pulsed power is a technology that involves storing energy over a period of time and releasing it instantly, creating short but powerful electrical pulses. To produce transient high-voltage pulses from direct current (DC) power supplies, a type of circuit called a Marx generator is conventionally used. Today, given the evolution of semiconductor devices and power electronics, solid state Marx generators (SSMGs) are used to enable flexible and fast pulse modulation capabilities. They include several power stages, each including a capacitor. The capacitors of the power stages are charged in parallel during a charging phase and then discharged in series during a discharging phase to generate a high-voltage pulse. SSMGs are used in a variety of applications in industry and in the military, such as for powering plasma sources for ion implantation, microwave generators, high pulsed power lasers, and more.

Because of the way the charging phases operate, and to limit voltage ripple, the capacitors of the power stages are designed to be very large. This leads to very large, and sometimes inflexible, design constraints depending on the application requirements. Two additional challenges of power stages using SSMGs are: i) a high voltage drop for long discharge pulses; and ii) large inrush currents during charging phases which can damage the input power source.

SUMMARY

Embodiments of the present disclosure relate to a power stage of a pulsed power generator, a pulsed power generator that comprises a plurality of the power stages and methods of controlling the power stage.

One example of the power stage of a pulsed power generator includes a half bridge based Marx generator power cell and a pulsating power buffer. The half bridge based Marx generator power cell includes a main capacitor connected between a positive input terminal and a negative input terminal, and a main half bridge switch circuit connected in parallel with the main capacitor and configured to alternately connect the main capacitor in series or in parallel with a main storage capacitor of an adjoining power stage respectively corresponding to a main capacitor discharging phase and a main capacitor charging phase. The pulsating power buffer, which is connected in a boost mode or a buck mode configuration and in parallel with the main capacitor, includes an auxiliary capacitor, an inductor, and an auxiliary half bridge switch circuit. The auxiliary half bridge switch circuit includes first and second switches that are configured to be switched in a complementary manner based on a main voltage across the main capacitor to set the pulsating power buffer in a discharging phase during the main capacitor discharging phase when the main voltage is less than a threshold voltage, and set the pulsating power buffer in a charging phase during the main capacitor charging phase when the main voltage is greater than a threshold voltage. During the discharging phase of the pulsating power buffer a discharge current is delivered from the auxiliary capacitor through the inductor that supplements the main voltage. During the charging phase of the pulsating power buffer a charge current is delivered to the auxiliary capacitor through the inductor that increases a voltage across the auxiliary capacitor during the main capacitor charging phase.

In one embodiment, the main half bridge switch circuit includes a discharging switch and a charging switch. The main capacitor is set in the discharging phase when the discharging switch is closed and the charging switch is open. The main capacitor is set in the charging phase when the discharging switch is open and the charging switch is closed.

In one embodiment, the pulsating power buffer is connected in the buck mode configuration, in which the auxiliary half bridge switch circuit is connected in parallel with the main capacitor and the inductor is connected in series with a cathode of the auxiliary capacitor and a junction between the first and second switches. The first and second switches are switched in a complementary manner to drive the discharge current from the auxiliary capacitor through the inductor and the first switch during the discharging phase of the pulsating power buffer. The first and second switches are switched in a complementary manner to drive the charge current through the first switch and the inductor to the auxiliary capacitor during the charging phase of the pulsating power buffer.

In one embodiment, the first and second switches are switched at least five times during the main capacitor discharging phase based on a pulse width modulation strategy.

In one embodiment, the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor. The first and second switches are switched in a complementary manner to drive the discharge current from the auxiliary capacitor through the first switch and the inductor during the discharging phase of the pulsating power buffer. The first and second switches are switched in a complementary manner to drive the charge current through the inductor and the first switch to the auxiliary capacitor during the charging phase of the pulsating power buffer.

In one embodiment, the first and second switches are switched at least five times during the main capacitor discharging phase based on a pulse width modulation strategy.

In one embodiment, the main capacitor includes a cathode connected to a positive input terminal and an anode connected to a negative input terminal. The power stage includes a diode having an anode connected to the positive input terminal and a cathode connected to a positive output terminal. A negative output terminal is connected to a junction between the discharging and charging switches.

One example of a pulse power generator includes an input power source, a plurality of power stages, a voltage detector and a controller. Each of the power stages includes a half bridge based Marx generator power cell and a pulsating power buffer. The half bridge based Marx generator power cell includes a main capacitor connected between a positive input terminal and a negative input terminal, and a main half bridge switch circuit connected in parallel with the main capacitor and configured to alternately set the power cell in a discharging phase or a charging phase. The pulsating power buffer, which is connected in a boost mode or a buck mode configuration and in parallel with the main capacitor, includes an auxiliary capacitor, an inductor, and an auxiliary half bridge switch circuit including first and second switches. The voltage detector configured to detect a main voltage across the main capacitors. The controller is configured to set or operate each power stage in a discharging phase, in which the main capacitor is set in a discharging phase and the pulsating power buffer is set in a discharging phase, and set or operate each power stage in a charging phase, in which the main capacitor is set in a charging phase and the pulsating power buffer is set in a charging phase. The controller sets the main capacitor in the discharging phase by controlling the main half bridge switch to connect the main capacitor in series with the main capacitor of an adjoining power stage, and sets the pulsating power buffer in the discharging phase by switching the first and second switches in a complementary manner when the main voltage is less than a threshold voltage to deliver a discharge current from the auxiliary capacitor through the inductor that supplements the main voltage. The controller sets the main capacitor in the charging phase by controlling the main half bridge switch to connect the main capacitor in parallel with the input power source, and sets the pulsating power buffer in the charging phase by switching the first and second switches in a complementary manner when the main voltage is greater than a threshold voltage to deliver a charge current to the auxiliary capacitor through the inductor that increases a voltage across the auxiliary capacitor.

In one embodiment, the main half bridge switch circuit of each power cell includes a discharging switch and a charging switch. The controller sets the main capacitor in the discharging phase by closing the discharging switch and opening the charging switch. The controller sets the main capacitor in the charging phase by opening the discharging switch and closing the charging switch.

In one embodiment, for each power stage, the pulsating power buffer is connected in the buck mode configuration, in which the auxiliary half bridge switch circuit is connected in parallel with the main capacitor and the inductor is connected in series with a cathode of the auxiliary capacitor and a junction between the first and second switches, the first and second switches are switched in a complementary manner to drive the discharge current from the auxiliary capacitor through the inductor and the first switch during the discharging phase of the pulsating power buffer, and the first and second switches are switched in a complementary manner to drive the charge current through the first switch and the inductor to the auxiliary capacitor during the charging phase of the pulsating power buffer.

In one embodiment, for each power stage, the controller switches the first and second switches at least five times during the main capacitor discharging phase.

In one embodiment, for each power stage the main capacitor includes a cathode connected to a positive input terminal and an anode connected to a negative input terminal, the power stage includes a diode having an anode connected to the positive input terminal and a cathode connected to a positive output terminal, a negative output terminal is connected to a junction between the discharging and charging switches, and the auxiliary capacitor is connected between the negative input terminal and a junction between the first and second switches through the inductor.

In one embodiment, for each power stage, the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor, the first and second switches are switched in a complementary manner to drive the discharge current from the auxiliary capacitor through the first switch and the inductor during the discharging phase of the pulsating power buffer, and the first and second switches are switched in a complementary manner to drive the charge current through the inductor and the first switch to the auxiliary capacitor during the charging phase of the pulsating power buffer.

In one embodiment, for each power stage, the controller switches the first and second switches at least five times during the main capacitor discharging phase.

In one embodiment, for each power stage, the main capacitor includes a cathode connected to a positive input terminal and an anode connected to a negative input terminal, the power stage includes a diode having an anode connected to the positive input terminal and a cathode connected to a positive output terminal, a negative output terminal is connected to a junction between the discharging and charging switches, and the auxiliary capacitor is connected between the anode of the main capacitor and a cathode of the first switch.

In one example of a method of controlling a power stage of a pulsed power generator, the pulse power generator includes: an input power source; a plurality of power stages, a voltage detector and a controller. Each power stage includes a half bridge based Marx generator power cell and a pulsating power buffer. The half bridge Marx generator power cell includes a main capacitor connected between a positive input terminal and a negative input terminal, and a main half bridge switch circuit connected in parallel with the main capacitor and configured to alternately set the power cell in a discharging phase or a charging phase. The pulsating power buffer, which is connected in a boost mode or a buck mode configuration and in parallel with the main capacitor, includes an auxiliary capacitor, an inductor, and an auxiliary half bridge switch circuit including first and second switches. The voltage detector is configured to detect a main voltage across the main capacitors. In the method, each power stage is set in a discharging phase using the controller including: setting the main capacitor in a discharging phase including controlling the main half bridge switch to connect the main capacitor in series with the main capacitor of an adjoining power stage; and setting the pulsating power buffer in a discharging phase including switching the first and second switches in a complementary manner when the main voltage is less than a threshold voltage to deliver a discharge current from the auxiliary capacitor through the inductor that supplements the main voltage. Additionally, each power stage is set in a charging phase using the controller including: setting the main capacitor in a charging phase including controlling the main half bridge switch to connect the main capacitor in parallel with the input power source; and setting the pulsating power buffer in a charging phase including switching the first and second switches in a complementary manner when the main voltage is greater than a threshold voltage to deliver a charge current to the auxiliary capacitor through the inductor that increases a voltage across the auxiliary capacitor.

In one embodiment, for each power cell, the main half bridge switch circuit includes a discharging switch and a charging switch. The main capacitor is set in the discharging phase by closing the discharging switch and opening the charging switch, and the main capacitor is set in the charging phase by opening the discharging switch and closing the charging switch.

In one embodiment, for each power stage, the pulsating power buffer is connected in the buck mode configuration, in which the auxiliary half bridge switch circuit is connected in parallel with the main capacitor. The pulsating power buffer is set in the discharging phase by switching the first and second switches in a complementary manner to drive the discharge current from the auxiliary capacitor through the inductor and the first switch. The pulsating power buffer is set in the charging phase by switching the first and second switches in a complementary manner to drive the charge current through the first switch and the inductor to the auxiliary capacitor.

In one embodiment, for each power stage, the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor. The pulsating power buffer is set in the discharging phase by switching the first and second switches in a complementary manner to drive the discharge current from the auxiliary capacitor through the first switch and the inductor. The pulsating power buffer is set in the charging phase by switching the first and second switches in a complementary manner to drive the charge current through the inductor and the first switch to the auxiliary capacitor.

In one embodiment, the switching of the first and second switches in a complementary manner based on the main voltage to deliver the discharge current from the auxiliary capacitor through the inductor that supplements the main voltage comprises switching the first and second switches at least five times during the discharging phase of the main capacitor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
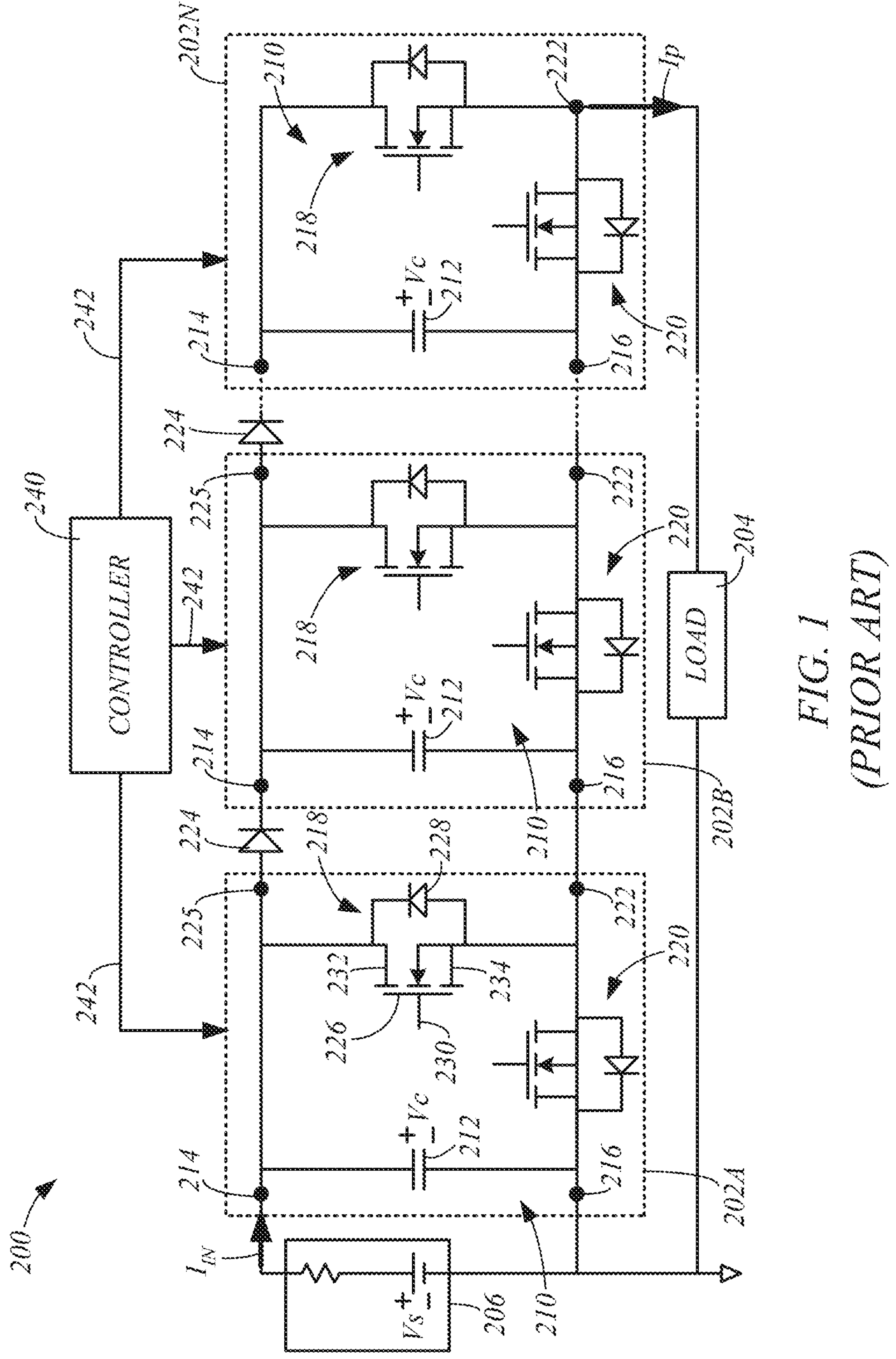
FIG. 1 is a simplified circuit diagram of an example of a pulse power generator, in accordance with the prior art.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Embodiments of the present disclosure generally relate to pulsed power generation using Marx generator based power stages that provide improvements over conventional designs.

FIG. 1 is a simplified circuit diagram of an example of a conventional pulse power generator 200 comprising multiple power stages 202 (e.g., power stages 202A-202N) that are used to drive current pulses Ip and provide a desired pulse width modulated voltage to a load 204. The generator 200 includes an input power source 206 that provides a direct current (DC) supply voltage $V_S$ and an input current $I_{IN}$ to the power stages 202.

Each power stage 202 includes a half bridge based Marx generator power cell 210, which includes a main capacitor (e.g., an electrolytic capacitor), which is connected in parallel with the power source 206 between a positive input node or terminal 214 and a negative input node or terminal 216, a discharging switch 218 and a charging switch 220. The discharging switch 218 is connected between the terminal 214 and a negative output node or terminal 222 and the charging switch 220 is connected between the terminal 216 and the terminal 222. A diode 224 may be connected between a pair of adjoining power stages 202, such as between a positive output node or terminal 225 of one of the power stages 202 (e.g., 202A) and the positive input terminal 214 of the adjoining power stage 202 (e.g., 202B), for example.

The switches 218 and 220, as well as other switches of the present disclosure, may take on a conventional form and comprise a switching element 226 connected in antiparallel with a unidirectional conduction element 228, such as a diode, as shown in FIG. 1. The switching element 226 may take the form of a conventional semiconductor switching element, such as a metal oxide semiconductor field effect transistor (MOSFET), such as an n-channel MOSFET having a drain 230, a gate 232, and a source 234, as illustrated by the switching element 226 forming the discharging switch 218 of the power stage 202A. Other suitable switching elements include, for example, bipolar transistors, an insulated-gate bipolar transistor (IGBT), high-electron-mobility transistor (HEMT), or other conventional or compatible switching elements.

A controller 240 may be used to control each of the power stages 202 to perform either a charging phase or a discharging phase of the main capacitor 112 using complimentary control signals 242 to the power switches 218 and 220, such as to the gates 232 of the switching elements 226 of the power stage 202 to activate or close one of the discharging switch 218 or the charging switch 220 and deactivate or open the other of the switches 218 and 220.

During a charging phase the controller 240 activates the charging switch 220 of each power stage 202 and deactivates the discharging switch 218 using the control signals 242. This causes the main capacitors 212 to be charged in parallel through a high-impedance path by the input current $I_{IN}$ produced by the input power source 206.

During a discharging phase, the controller 240 reverses the control signals 242 to each of the power stages 202 to deactivate the charging switches 220 and activate the discharging switches 218. This connects the main capacitors 212 in series with each other through the discharging switches 218, which multiplies the voltage and drives the current pulse Ip to the load 204.

The controller 240 switches the power stages 202 between the charging and discharging phases as necessary using the control signals 242 to supply the desired pulse width modulated voltage and pulse current Ip to the load 204.

As mentioned above, because of the way the charging phases operate, and to limit voltage ripple, the capacitors 212 of the power stages 202 are designed to be very large (e.g., 10_s_ or 100_s_ of mF). This leads to very large, and sometimes inflexible, design constraints depending on the application requirements.

There are additional challenges to the use of the power stages 202 utilizing Marx generator power cells 210. For example, large discharge pulses Ip produce a large drop in the voltage $V_C$ across the main capacitors 212 during the discharging phase. During the subsequent charging phase, a large inrush current $I_{IN}$ may be generated that can damage the input power source 206.

Embodiments of the present disclosure relate to improvements to the conventional power stages described above that operate to limit the voltage swing on the capacitors 212 of the Marx generator power cells 210. This reduces both the maximum voltage drop across the main capacitors in response to large discharge pulses Ip, and the maximum inrush current $I_{IN}$ during a subsequent charging phase. In addition to reducing voltage ripple on the main capacitors and the strain on the input power source, embodiments of the present disclosure also allow for a significant reduction in the overall capacitor requirements of the generator, which allows the power generator to be formed smaller and utilize ceramic capacitors, which are more tolerant of extreme temperatures than the electrolytic capacitors typically used in conventional pulse power generators 200.

Figure 2:
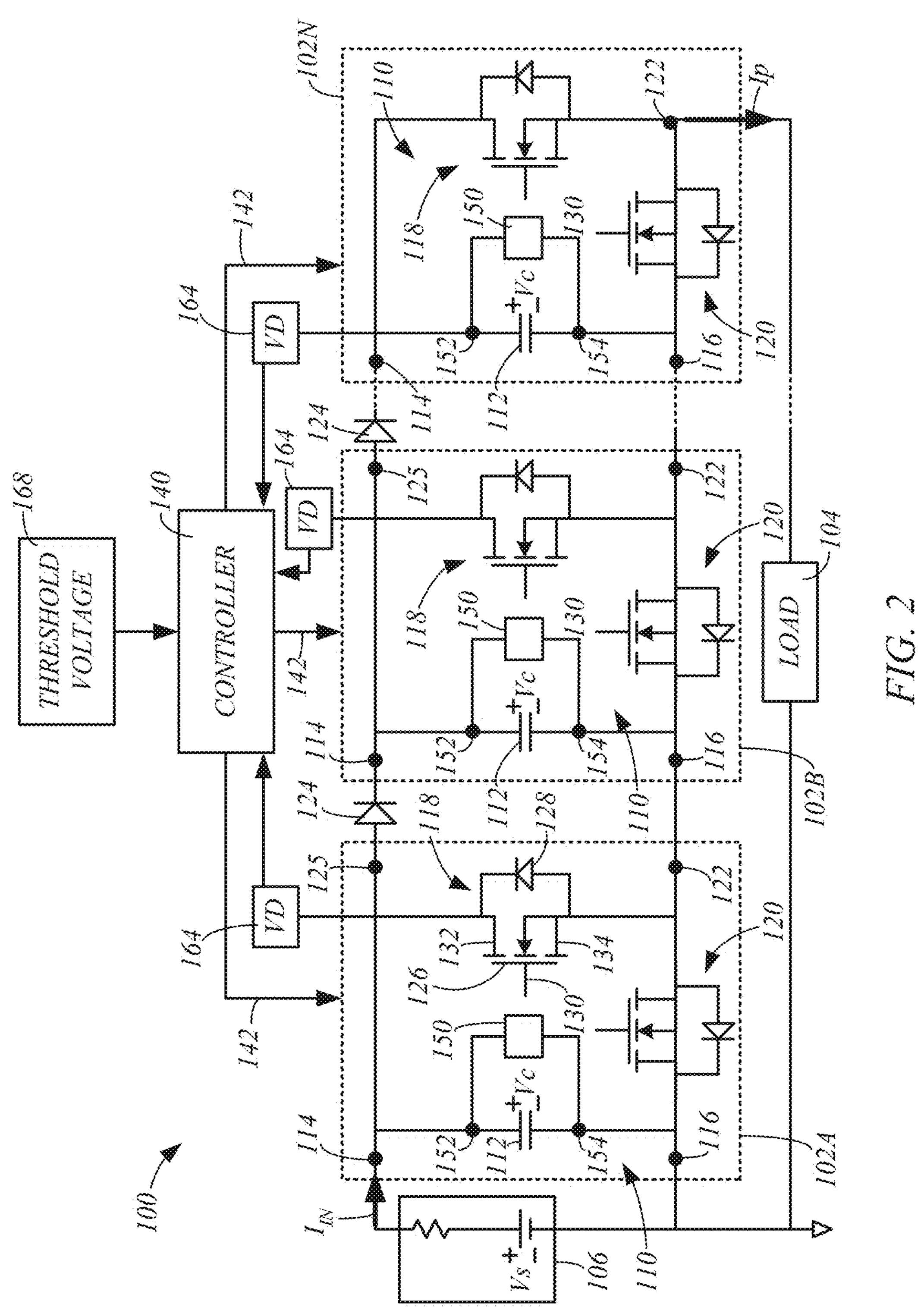
FIG. 2 is a simplified circuit diagram of an example of a pulse power generator, in accordance with embodiments of the present disclosure.

FIG. 2 is a simplified circuit diagram of an example of a pulse power generator 100, in accordance with embodiments of the present disclosure. As with the pulse power generator 200 discussed above, the pulse power generator 100 includes multiple power stages 102 (e.g., power stages 102A-102N) that are used to drive current pulses Ip and provide a desired pulse width modulated voltage to a load 104. The generator 100 includes an input power source 106 that provides a direct current (DC) supply voltage $V_S$ and an input current $I_{IN}$ to the power stages 102.

Each power stage 102 includes a half bridge based Marx generator power cell 110 that operates in accordance with the SSMG described above. Thus, the power cell includes a main capacitor or main storage capacitor 112, which is connected in parallel with the power source 106 between a positive input node or terminal 114 and a negative input node or terminal 116, a discharging switch 118 and a charging switch 120. The discharging switch 118 is connected between the terminal 114 and a negative output node or terminal 122 and the charging switch 120 is connected between the terminal 116 and the terminal 122. A diode 124 may be connected between a pair of adjoining power stages 102, such as between a positive output node or terminal 125 of one of the power stages 102 (e.g., 102A) and the positive input terminal 114 of the adjoining power stage 102 (e.g., 102B), for example.

The switches 118 and 120, as well as other switches of the present disclosure, may take on a conventional form and comprise a switching element 126 connected in antiparallel with a unidirectional conduction element 128, such as a diode, as discussed above with regard to the switching element 226 (FIG. 1). The switching element 126 may take the form of a conventional semiconductor switching element, such as a metal oxide semiconductor field effect transistor (MOSFET), such as an n-channel MOSFET having a drain 130, a gate 132, and a source 134, as illustrated by the switching element 126 forming the discharging switch 118 of the power stage 102A. Other suitable switching elements include, for example, bipolar transistors, an insulated-gate bipolar transistor (IGBT), high-electron-mobility transistor (HEMT), or other conventional or compatible switching elements.

A controller 140 of the power generator 100, which may represent control circuitry, one or more processors, etc., controls the charging and discharging phases of each power cell 110 and its main capacitor 112 using complimentary control signals 142 to the discharging switch 118 and charging switch 120. The controller 140 sets the power cell 110 of each power stage 102 in the charging phase, in which the main capacitor 112 is connected in parallel with the input power source 106 and the main capacitors 112 of the other power stages 102, such as that of the adjoining power stage 102, by opening the discharging switch 118 and closing the charging switch 120. The controller 140 sets the power cell 110 of each power stage 102 in the discharging phase by closing the discharging switch 118 and opening the charging switch 120. This connects the main capacitors 112 in series with each other and produces the pulse current Ip.

In some embodiments, each power stage 102 includes a pulsating power buffer 150 that is connected in parallel to the main capacitor 112, such as at the nodes 152 and 154. As discussed below, the pulsating power buffer 150 generally includes a half bridge switch circuit and an auxiliary capacitor that may be connected in a buck or boost mode configuration. The pulsating power buffer 150 operates to limit voltage swings of the voltage $V_C$ across the main capacitor 112 using the charge on the auxiliary capacitor during discharging phases of the main capacitor 112 when large current pulses Ip are produced. The pulsating power buffer 150 also provides the benefit of limiting the inrush current $I_{IN}$ from the input power source 106 and reducing voltage ripple, among other benefits.

Figure 3:
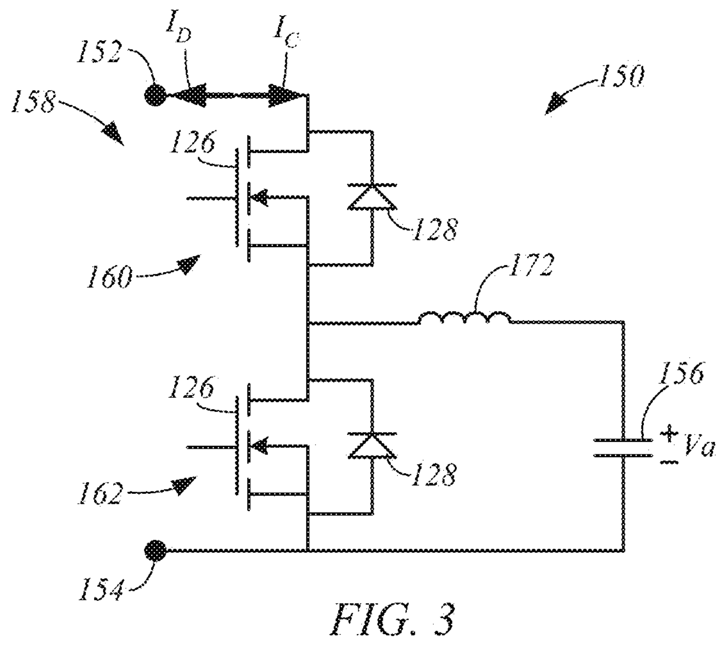
FIGS. 3 and 4 are simplified circuit diagrams of examples of the pulsating power buffer, in accordance with embodiments of the present disclosure.
Figure 4:
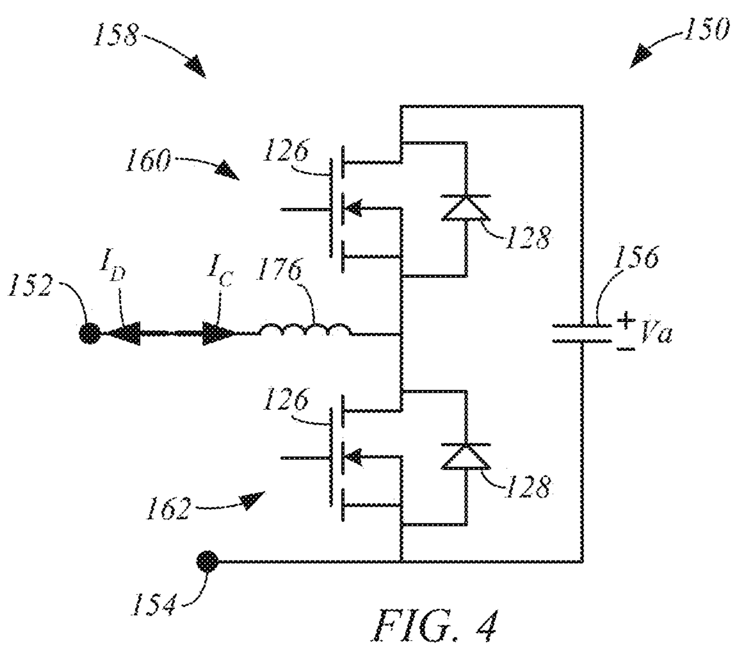

Examples of the pulsating power buffer 150, each comprising the auxiliary capacitor 156 and auxiliary half bridge switch 158, are shown in the circuit diagrams of FIGS. 3 and 4. The auxiliary half bridge switch 158 includes a first switch 160 and a second switch 162 that are controlled by the controller 140 in a complimentary manner and in accordance with a pulse width modulation strategy to set or operate the pulsating power buffer 150 in a discharging phase when the corresponding power cell 110 and the main capacitor 112 are in the discharging phase and when the main voltage $V_C$ is below a threshold voltage, and set or operate the pulsating power buffer 150 in a charging phase when the power cell 110 and the main capacitor 112 are in the charging phase and when the main voltage $V_C$ is greater than a threshold voltage. The switches 160 and 162 may each take the form of the switching elements 118 and 120 discussed above and comprise the switching element 126 connected in antiparallel with the unidirectional conduction element 128 (e.g., diode).

In some embodiments, each power stage 102 of the power generator 100 includes one or more voltage detectors 164 that are used to detect the voltages $V_C$ across the main capacitors 112 or at the cathode of the main capacitors 112 relative to electrical ground, as indicated in FIG. 2. Each voltage detector 164 generates a voltage signal 166 that is indicative of the corresponding voltage $V_C$. In some embodiments, the controller 140 controls the first and second switches 160 and 162 of the each auxiliary half bridge switch 158 based on the voltage $V_C$ that is detected by the voltage detector 164 and at least one threshold voltage 168, which generally sets a limit on the drop in the voltage $V_C$ across the main capacitors 112.

The pulsating power buffer 150 shown in FIG. 3 is in a buck mode configuration. Here, the auxiliary half bridge switch 158 is connected in parallel with the main capacitor 112 through the nodes 152 and 154. A cathode of the auxiliary capacitor 156 is connected to a junction 170 between the first and second switches 160 and 162, such as through an inductor 172, and an anode of the auxiliary capacitor is connected to the node 154.

During the discharging phase of the main capacitor 112 or the power cell 110 and when the voltage $V_C$ is less than the threshold voltage 168 and the voltage VA across the auxiliary capacitor 156 is greater than the voltage $V_C$, the pulsating power buffer 150 is set to or operated in a discharging phase to supplement the main capacitor voltage $V_C$. In one embodiment of the pulsating power buffer discharging phase, the controller 140 switches the first switch 160 and the second switch 162 in a complementary in accordance with a pulse width modulation strategy that drives a pulse width modulated discharge current Ip from the auxiliary capacitor 156 through the inductor 172 and the first switch 160 to the node 152 that supplements the main voltage $V_C$ and maintains the voltage $V_C$ at or above the threshold voltage 168.

During the charging phase of the main capacitor 112 or the power cell 110 and when the voltage $V_C$ is greater than the threshold voltage 168, the pulsating power buffer 150 is set to or operated in a charging phase to charge the voltage VA across the auxiliary capacitor 156. In one embodiment of the pulsating power buffer charging phase, the controller 140 switches the first switch 160 and the second switch 162 in a complementary in accordance with a pulse width modulation strategy that drives a pulse width modulated charge current $I_C$ from the node 152 through the first switch 160 and the inductor 172 to the auxiliary capacitor 156 to increase the voltage VA and charge the auxiliary capacitor 156 in preparation for the next pulsating power buffer discharging phase.

The pulsating power buffer 150 shown in FIG. 4 is in a boost mode configuration. Here, a junction 174 between the first and second switches 160 and 162 of the auxiliary half bridge switch 158 is connected to the cathode of the main capacitor 112 and the node 152, such as through an inductor 176, and the second switch 162 is connected in parallel with the main capacitor 112. The auxiliary capacitor 156 is connected between a cathode of the first switch 160 and the anode of the main capacitor 112 and node 154.

During the discharging phase of the main capacitor 112 or the power cell 110 and when the voltage $V_C$ is less than the threshold voltage 168 and the voltage VA across the auxiliary capacitor 156 is greater than the voltage $V_C$, the pulsating power buffer 150 is set to or operated in a discharging phase to supplement the main capacitor voltage $V_C$. In one embodiment of the pulsating power buffer discharging phase, the controller 140 switches the first switch 160 and the second switch 162 in a complementary in accordance with a pulse width modulation strategy that drives a pulse width modulated discharge current Ip from the auxiliary capacitor 156 through the inductor 172 and the first switch 160 to the node 152 that supplements the main voltage $V_C$ and maintains the voltage $V_C$ at or above the threshold voltage 168.

During the charging phase of the main capacitor 112 or the power cell 110 and when the voltage $V_C$ is greater than the threshold voltage 168, the pulsating power buffer 150 is set to or operated in a charging phase to charge the voltage VA across the auxiliary capacitor 156. In one embodiment of the pulsating power buffer charging phase, the controller 140 switches the first switch 160 and the second switch 162 in a complementary in accordance with a pulse width modulation strategy that drives a pulse width modulated charge current $I_C$ from the node 152 through the inductor 172 and the first switch 160 to the auxiliary capacitor 156 to increase the voltage VA and charge the auxiliary capacitor 156 in preparation for the next pulsating power buffer discharging phase.

In some embodiments, of the first and second switches 160 and 162 of the pulsating power buffer 150 are switched during the pulsating power buffer discharging phase and the main capacitor discharging phase at least five times during the generation of the current pulse Ip. In one example, the main capacitor discharging phase is approximately 5-15 microseconds, and the first and second switches 160 and 162 are switched at a frequency of about 0.3-1.0 MHz. To meet this high frequency switching demand, the first and second switches 160 and 162 may comprise, for example, 3.3 kV gallium nitride (GaN) devices.

In one embodiment, the threshold voltage 168 is set to limit the voltage swing of the voltage $V_C$ across the main capacitor 112 to approximately 1-3%, such as 2%, of the supply voltage $V_S$, for example. This is a significant reduction to the voltage swing that may be encountered by the conventional power stages 202 of the prior art shown in FIG. 1 during the main capacitor discharging phase, which may exceed 10% of the supply voltage $V_S$, for example. As a result, the pulsating power buffer 150 facilitates significant reductions in the peak voltage drop across the main capacitors 112 and the maximum inrush current $I_{IN}$ that must be supplied by the input voltage source 106 during the discharging phases of the main capacitor 112 and power cell 110, as compared to the conventional pulse power generator 200.

Additionally, during the charging phases of the main capacitor 112 and power cell 110 and the pulsating power buffer 150, the threshold voltage 168 is used to prioritize the charging of the main capacitors 112 over the auxiliary capacitors 156 by only charging the auxiliary capacitors 156 when the main voltages $V_C$ exceeds the threshold voltage 168. This also reduces the current $I_{IN}$ during the charging phases.

In some embodiments, the voltage VA across the auxiliary capacitors 156 has a large voltage swing, such as up to 100%. Thus, in some embodiments, there is a large voltage ripple across the auxiliary capacitors 156 while maintaining a small voltage ripple across the main capacitors 110. As a result, the overall capacitor requirement for the main capacitors 112 may be reduced by 10-20 times or more depending on the peak to average power ratio. Accordingly, the pulsed power generator 100 utilizing the pulsating power buffers 150 may be formed significantly smaller than the conventional pulsed power generator 200. Furthermore, while the main capacitors 212 of the conventional pulsed power generator 200 generally comprise cost-effective electrolytic capacitors, the reduction in the capacitance requirement facilitated by the pulsating power buffers 150 allows for the use of ceramic capacitors, which are more tolerant of extreme temperatures than electrolytic capacitors. Thus, the pulse power generator 100 may be configured for high temperature applications.

Figure 5:
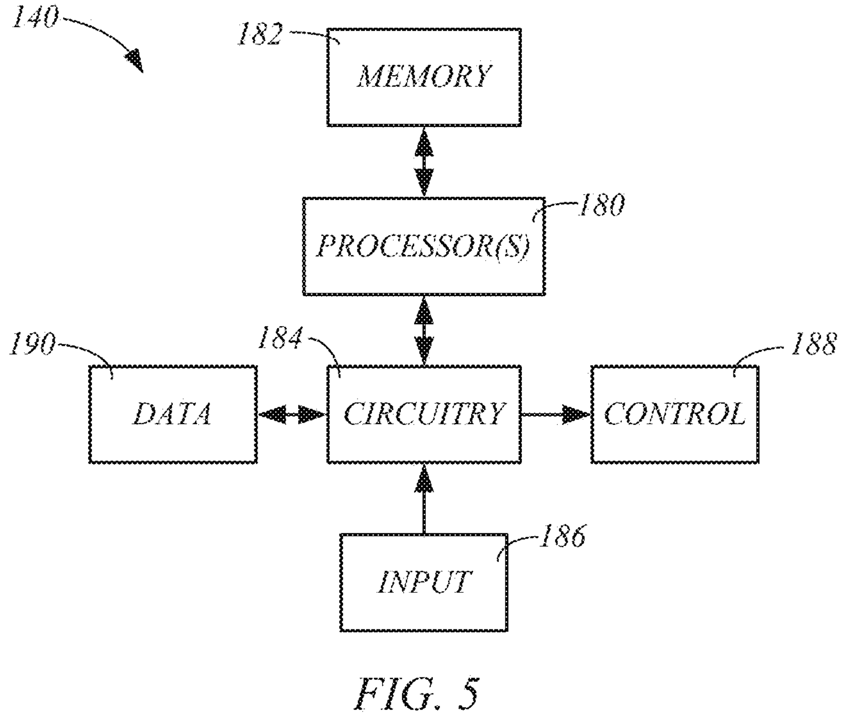
FIG. 5 is a simplified diagram of an example controller, in accordance with embodiments of the present disclosure.

While functions described herein may be disclosed as being performed by a single controller (e.g., controller 140), it is understood that the functions may be performed by a single controller or multiple controllers and/or using suitable circuitry. The controller 140 may take on any suitable patent-eligible form, such as that of the example controller 140 shown in FIG. 5.

The controller 140 may include one or more processors 180 and memory 182, which may be local memory or memory that is accessible to the controller 140. The one or more processors 180 are configured to perform various functions described herein in response to the execution of instructions contained in the memory 182, such as a test program, for example.

The one or more processors 180 may be components of one or more computer-based systems, and may include one or more control circuits, microprocessor-based engine control systems, and/or one or more programmable hardware components, such as a field programmable gate array (FPGA). The memory 182 represents local and/or remote memory or computer-readable media. As used herein, such memory 182 comprises any suitable patent subject matter eligible computer-readable media and does not include transitory waves or signals. Examples of the memory 182 include conventional data storage devices, such as hard disks, CD-ROMs, optical storage devices, magnetic storage devices and/or other suitable data storage devices. The controller 140 may include circuitry 184 for use by the one or more processors 180 to receive input signals 186 (e.g., voltage signals 166), issue control signals 188 (e.g., switch control signals 142) and/or communicate data 190, such as in response to the execution of the instructions stored in the memory 182 by the one or more processors 180.

Although the embodiments of the present disclosure have been described with reference to preferred embodiments, workers skilled in the art will recognize that changes may be made in form and detail without departing from the spirit and scope of the present disclosure.

What is claimed is:

1. A power stage of a pulsed power generator comprising:

a half bridge based Marx generator power cell comprising:

a main capacitor connected between a positive input terminal and a negative input terminal; and a main half bridge switch circuit connected in parallel with the main capacitor and configured to alternately connect the main capacitor in series or in parallel with a main storage capacitor of an adjoining power stage respectively corresponding to a main capacitor discharging phase and a main capacitor charging phase; and a pulsating power buffer connected in a boost mode or a buck mode configuration and in parallel with the main capacitor, the pulsating power buffer comprising:

an auxiliary capacitor;

an inductor; and an auxiliary half bridge switch circuit comprising first and second switches configured to be switched in a complementary manner based on a main voltage across the main capacitor to set the pulsating power buffer in a discharging phase during the main capacitor discharging phase when the main voltage is less than a threshold voltage, and set the pulsating power buffer in a charging phase during the main capacitor charging phase when the main voltage is greater than a threshold voltage, wherein:

during the discharging phase of the pulsating power buffer a discharge current is delivered from the auxiliary capacitor through the inductor that supplements the main voltage; and during the charging phase of the pulsating power buffer a charge current is delivered to the auxiliary capacitor through the inductor that increases a voltage across the auxiliary capacitor during the main capacitor charging phase.

2. The power stage according to claim 1, wherein:

the main half bridge switch circuit comprises:

a discharging switch; and a charging switch;

the main capacitor is set in the discharging phase when the discharging switch is closed and the charging switch is open; and the main capacitor is set in the charging phase when the discharging switch is open and the charging switch is closed.

3. The power stage according to claim 2, wherein:

the pulsating power buffer is connected in the buck mode configuration, in which the auxiliary half bridge switch circuit is connected in parallel with the main capacitor and the inductor is connected in series with a cathode of the auxiliary capacitor and a junction between the first and second switches;

the first and second switches are switched in a complementary manner to drive the discharge current from the auxiliary capacitor through the inductor and the first switch during the discharging phase of the pulsating power buffer; and the first and second switches are switched in a complementary manner to drive the charge current through the first switch and the inductor to the auxiliary capacitor during the charging phase of the pulsating power buffer.

4. The power stage according to claim 3, wherein the first and second switches are switched at least five times during the main capacitor discharging phase based on a pulse width modulation strategy.

5. The power stage according to claim 2, wherein:

the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor;

the first and second switches are switched in a complementary manner to drive the discharge current from the auxiliary capacitor through the first switch and the inductor during the discharging phase of the pulsating power buffer; and the first and second switches are switched in a complementary manner to drive the charge current through the inductor and the first switch to the auxiliary capacitor during the charging phase of the pulsating power buffer.

6. The power stage according to claim 5, wherein the first and second switches are switched at least five times during the main capacitor discharging phase based on a pulse width modulation strategy.

7. The power stage according to claim 2, wherein:

the main capacitor includes a cathode connected to a positive input terminal and an anode connected to a negative input terminal;

the power stage includes a diode having an anode connected to the positive input terminal and a cathode connected to a positive output terminal; and a negative output terminal is connected to a junction between the discharging and charging switches.

8. A pulse power generator comprising:

an input power source;

a plurality of power stages, each comprising:

a half bridge based Marx generator power cell comprising:

a main capacitor connected between a positive input terminal and a negative input terminal; and a main half bridge switch circuit connected in parallel with the main capacitor and configured to alternately set the power cell in a discharging phase or a charging phase;

a pulsating power buffer connected in a boost mode or a buck mode configuration and in parallel with the main capacitor, the pulsating power buffer comprising:

an auxiliary capacitor;

an inductor; and an auxiliary half bridge switch circuit including first and second switches;

a voltage detector configured to detect a main voltage across the main capacitors; and a controller configured to:

set each power stage in a discharging phase including:

setting the main capacitor in a discharging phase including controlling the main half bridge switch to connect the main capacitor in series with the main capacitor of an adjoining power stage; and setting the pulsating power buffer in a discharging phase including switching the first and second switches in a complementary manner when the main voltage is less than a threshold voltage to deliver a discharge current from the auxiliary capacitor through the inductor that supplements the main voltage; and set each power stage in a charging phase including:

setting the main capacitor in a charging phase including controlling the main half bridge switch to connect the main capacitor in parallel with the input power source; and setting the pulsating power buffer in a charging phase including switching the first and second switches in a complementary manner when the main voltage is greater than a threshold voltage to deliver a charge current to the auxiliary capacitor through the inductor that increases a voltage across the auxiliary capacitor.

9. The pulse power generator according to claim 8, wherein, for each power cell:

the main half bridge switch circuit comprises:

a discharging switch; and a charging switch;

the controller sets the main capacitor in the discharging phase by closing the discharging switch and opening the charging switch; and the controller sets the main capacitor in the charging phase by opening the discharging switch and closing the charging switch.

10. The pulse power generator according to claim 9, wherein, for each power stage:

the pulsating power buffer is connected in the buck mode configuration, in which the auxiliary half bridge switch circuit is connected in parallel with the main capacitor and the inductor is connected in series with a cathode of the auxiliary capacitor and a junction between the first and second switches;

the first and second switches are switched in a complementary manner to drive the discharge current from the auxiliary capacitor through the inductor and the first switch during the discharging phase of the pulsating power buffer; and the first and second switches are switched in a complementary manner to drive the charge current through the first switch and the inductor to the auxiliary capacitor during the charging phase of the pulsating power buffer.

11. The pulse power generator according to claim 10, wherein, for each power stage, the controller switches the first and second switches at least five times during the main capacitor discharging phase.

12. The pulse power generator according to claim 11, wherein, for each power stage:

the main capacitor includes a cathode connected to a positive input terminal and an anode connected to a negative input terminal;

the power stage includes a diode having an anode connected to the positive input terminal and a cathode connected to a positive output terminal;

a negative output terminal is connected to a junction between the discharging and charging switches; and the auxiliary capacitor is connected between the negative input terminal and a junction between the first and second switches through the inductor.

13. The pulse power generator according to claim 9, wherein, for each power stage:

the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor;

the first and second switches are switched in a complementary manner to drive the discharge current from the auxiliary capacitor through the first switch and the inductor during the discharging phase of the pulsating power buffer; and the first and second switches are switched in a complementary manner to drive the charge current through the inductor and the first switch to the auxiliary capacitor during the charging phase of the pulsating power buffer.

14. The pulse power generator according to claim 13, wherein, for each power stage, the controller switches the first and second switches at least five times during the main capacitor discharging phase.

15. The pulse power generator according to claim 14, wherein, for each power stage:

the main capacitor includes a cathode connected to a positive input terminal and an anode connected to a negative input terminal;

the power stage includes a diode having an anode connected to the positive input terminal and a cathode connected to a positive output terminal; and a negative output terminal is connected to a junction between the discharging and charging switches; and the auxiliary capacitor is connected between the anode of the main capacitor and a cathode of the first switch.

16. A method of controlling a power stage of a pulsed power generator, which includes:

an input power source;

a plurality of power stages, each comprising:

a half bridge based Marx generator power cell comprising:

a main capacitor connected between a positive input terminal and a negative input terminal; and a main half bridge switch circuit connected in parallel with the main capacitor and configured to alternately set the power cell in a discharging phase or a charging phase;

a pulsating power buffer connected in a boost mode or a buck mode configuration and in parallel with the main capacitor, the pulsating power buffer comprising:

an auxiliary capacitor;

an inductor; and an auxiliary half bridge switch circuit including first and second switches;

a voltage detector configured to detect a main voltage across the main capacitors; and a controller, the method comprising:

setting each power stage in a discharging phase using the controller including:

setting the main capacitor in a discharging phase including controlling the main half bridge switch to connect the main capacitor in series with the main capacitor of an adjoining power stage; and setting the pulsating power buffer in a discharging phase including switching the first and second switches in a complementary manner when the main voltage is less than a threshold voltage to deliver a discharge current from the auxiliary capacitor through the inductor that supplements the main voltage; and setting each power stage in a charging phase using the controller including:

setting the main capacitor in a charging phase including controlling the main half bridge switch to connect the main capacitor in parallel with the input power source; and setting the pulsating power buffer in a charging phase including switching the first and second switches in a complementary manner when the main voltage is greater than a threshold voltage to deliver a charge current to the auxiliary capacitor through the inductor that increases a voltage across the auxiliary capacitor.

17. The method according to claim 16, wherein:

for each power cell, the main half bridge switch circuit comprises:

a discharging switch; and a charging switch;

setting the main capacitor in the discharging phase includes closing the discharging switch and opening the charging switch; and setting the main capacitor in the charging phase includes opening the discharging switch and closing the charging switch.

18. The method according to claim 17, wherein:

for each power stage, the pulsating power buffer is connected in the buck mode configuration, in which the auxiliary half bridge switch circuit is connected in parallel with the main capacitor;

setting the pulsating power buffer in the discharging phase comprises switching the first and second switches in a complementary manner to drive the discharge current from the auxiliary capacitor through the inductor and the first switch; and setting the pulsating power buffer in the charging phase comprises switching the first and second switches in a complementary manner to drive the charge current through the first switch and the inductor to the auxiliary capacitor.

19. The method according to claim 17, wherein:

for each power stage, the pulsating power buffer is connected in the boost mode configuration, in which the inductor is connected in series between a cathode of the main capacitor and a junction between the first and second switches, the second switch is connected in parallel with the main capacitor and the first switch is connected in series between the junction and a cathode of the auxiliary capacitor;

setting the pulsating power buffer in the discharging phase comprises switching the first and second switches in a complementary manner to drive the discharge current from the auxiliary capacitor through the first switch and the inductor; and setting the pulsating power buffer in the charging phase comprises switching the first and second switches in a complementary manner to drive the charge current through the inductor and the first switch to the auxiliary capacitor.

20. The method according to claim 16, wherein, switching the first and second switches in a complementary manner based on the main voltage to deliver the discharge current from the auxiliary capacitor through the inductor that supplements the main voltage comprises switching the first and second switches at least five times during the discharging phase of the main capacitor.

* * * * *